United States Patent [19]

Tomany

[11] Patent Number: 4,584,524
[45] Date of Patent: Apr. 22, 1986

[54] MISSILE CONTROL SYSTEM TEST APPARATUS HAVING VIDEO SIGNAL ADAPTER

[75] Inventor: John P. Tomany, Tampa, Fla.

[73] Assignee: The United States of America as represented by the Secretary of the Air Force, Washington, D.C.

[21] Appl. No.: 520,386

[22] Filed: Aug. 4, 1983

[51] Int. Cl.⁴ .................. G01R 31/02; G01R 31/28; H04N 7/00; G09G 1/00
[52] U.S. Cl. .................. 324/73 R; 340/745; 358/104; 371/15
[58] Field of Search ............ 324/73 R, 73 AT; 358/10, 104, 107, 139; 371/15; 244/3.11, 3.14, 3.16, 3.19; 340/709, 721, 745, 767, 793

[56] References Cited

U.S. PATENT DOCUMENTS

| | | | |
|---|---|---|---|
| 3,035,229 | 5/1962 | Guderian et al. | 324/77 |
| 3,254,340 | 5/1966 | Sealander | 343/17.7 |
| 3,295,130 | 12/1966 | Prestwood | 343/17.7 |
| 3,518,779 | 7/1970 | Cox et al. | 324/73 R |
| 3,619,792 | 11/1971 | Capeci et al. | 328/130 |
| 3,665,303 | 5/1972 | Richards et al. | 324/73 R |
| 3,803,974 | 4/1974 | Everest et al. | 89/1.5 E |
| 4,358,732 | 11/1982 | Johnston et al. | 324/73 R |

Primary Examiner—Gerard R. Strecker
Attorney, Agent, or Firm—Donald J. Singer; Richard J. Donahue

[57] ABSTRACT

Apparatus for testing the performance of an airborne missile control system, said apparatus including a video signal adapter providing prescribed video displays and interposed between a programmable test set and the host aircraft.

1 Claim, 5 Drawing Figures

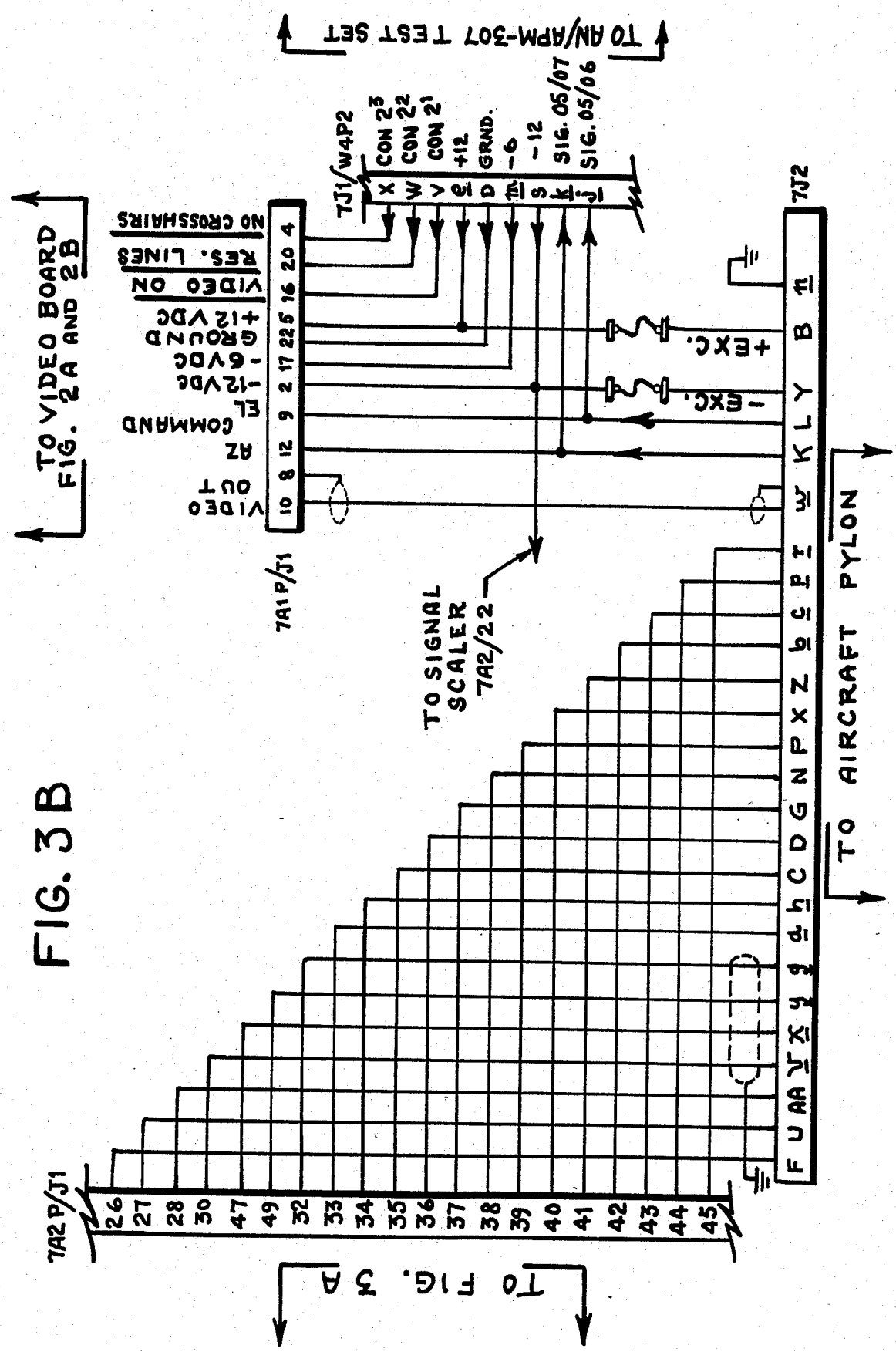

MISSILE CONTROL SYSTEM TEST APPARATUS HAVING VIDEO SIGNAL ADAPTER

STATEMENT OF GOVERNMENT INTEREST

The invention described herein may be manufactured and used by or for the Government for governmental purposes without the payment of any royalty thereon.

BACKGROUND OF THE INVENTION

The present invention relates to testing apparatus of the type which is especially useful in determining whether certain electronic equipment is operationally fit and particularly, to apparatus for testing the performance of an airborne missile control system.

There presently exists an automatic, programmable, dynamic test set (AN/APM-307) capable of testing virtually any weapons control function when provided with suitable interface adapters and program testing sequences. It is vastly under-utilized in this regard, especially since it provides a printed record of test failures for subsequent analysis. There also exists a test set (AN/ASM-184) which provides TV video signals which simulate those signals provided by the Walleye guided missile. This unit can be used in conjunction with the Maverick Interface Test Set (MITS) to test signals provided to and from the Maverick missile. The combination of the AN/ASM-184 and the MITS however, is cumbersome, and test results are open to operator interpretation. Additionally, it requires several people to operate and considerable time to perform the necessary tests. The MITS interface unit is necessary since the AN/ASM-184 provides a form of video signals which is unique to the Walleye missile and markedly different from other video signals provided by other weapons. The Maverick missile provides video signals which are essentially the same as U.S. commercial EIA video signals, while the Walleye produces much longer horizontal and vertical synchronization parameters. The AN/ASM-184 test set is also an expensive unit whose replacement parts are becoming increasingly more difficult to obtain.

Accordingly, it is an object of the present invention to provide apparatus capable of producing exact replicas of the Maverick missile video signals.

Another object of the present invention is to provide a video signal adapter that is adapted for use with the AN/APM-307 programmable, dynamic test set.

Still another object of the present invention is to provide a video signal adapter that can be used in conjunction with the aforementioned test set which will check all aircraft control signal lines for faults and will advise the operator of such faults with a printed record.

Yet another object of the present invention is to provide a cost effective way of adding new testing capabilities to the AN/APM-307 test set.

A further object of the present invention is to provide test apparatus which produces video displays which accurately mimmick those provided by in-use weapons systems, as well as those likely to be available in the future.

SUMMARY OF THE INVENTION

In accordance with the present invention, there is disclosed a video signal adapter which provides an EIA (U.S. commercial TV) compatable, 525 line, 60 Hz, video display for use by the host aircraft in three modes; gray scale, resolution lines, and moveable black crosshairs on a background of resolution lines. Video generation is provided by a series of CMOS digital dividers, counters and gates, with synchronization signals coming from a PMOS/LSI TV camera synchronization generator. Video amplitude levels are calibrated to meet any known specification by use of a special CMOS level shifter/inverter which is designed to accomodate input voltage levels significantly higher than its own supply voltage.

In the gray scale video presentation, a binary up-/down counter is loaded to a binary "15" during each horizontal sync pulse. The first three binary digits, ("1", "2", "4", but not "8") are fed to a level shifter/inverter and weighted resistor network to perform digital-/analog conversion. The counter then counts down, providing an eight step ascending staircase video output from the digital/analog converter (DAC). A second counter changes state every 32 horizontal lines, switching the first counter to the "count up" mode, where it now provides an eight step descending staircase video waveform. This alternation continues every 32 horizontal lines. The effect is virtually identical to that provided by the aforementioned AN/ASM-184 test set.

In the resolution line display, the counter/DAC is partially disabled and a 2.52 MHz signal is inserted in place of the staircase waveform. This corresponds to a "260 line" stationary video display. (Although 2.52 MHz is used in the present video signal adapter, any frequency, up to about 6 MHz could be used in place thereof.)

The crosshair video is identical to the resolution lines display except that black horizontal and vertical crosshairs are superimposed over the lines. The crosshair position on the scope face is synchronized with the aircraft Maverick controllers by comparing azimuth (AZ) and elevation (EL) control voltages from the aircraft with internal linear ramp voltages which are synchronized to the horizontal (H) and vertical (V) sync pulses. When the ramp voltage and AZ command voltages are equal, a comparator triggers a one-shot multivibrator. The multivibrator, in turn, cuts off the 2.52 MHz signal, for a short period of time, thus providing a dark line. This action repeats every horizontal line. Functioning for the EL command is identical, except the time periods involved are much longer, and the ramp is synchronized to the vertical sync pulse.

Aircraft control voltages and grounds are tested separately, by using voltage dividers which scale down these signals for measurement by the AN/APM-307 test set. Maverick AZ and EL command voltages from the aircraft are directly measured by the AN/APM-307, in addition to being processed by the video signal adapter for crosshair positioning.

DETAILED DESCRIPTION OF THE INVENTION

Figure 1:
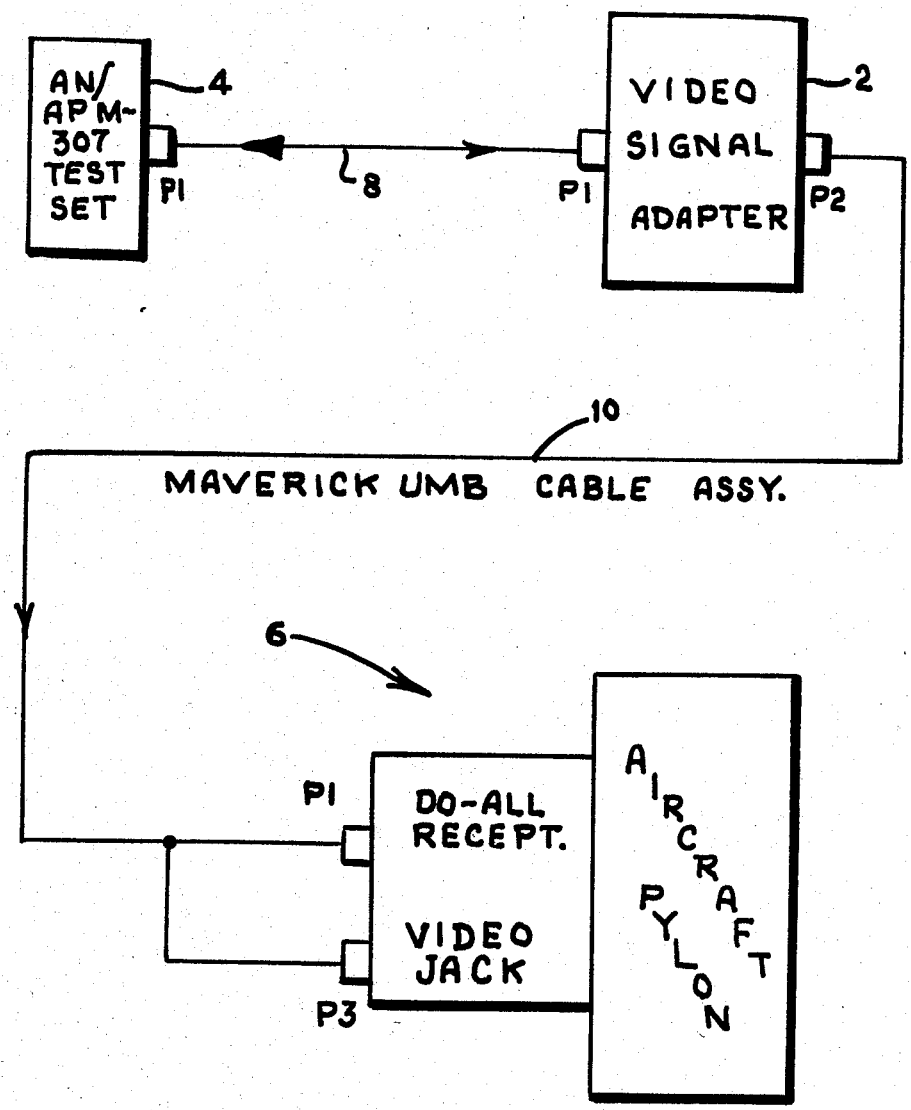
FIG. 1 is a block diagram representation of the present invention.

Referring now to FIG. 1 of the drawings, the video signal adapter 2 of the present invention is shown connected between the AN/APM-307 test set 4 and the pylon 6 of the aircraft under test. Such connections are made by way of a multi-wire cable 8 connected between the output connector P1 of the AN/APM-307 test set and the input connector P1 of the video signal adapter 2. Similarly, a multi-wire cable 10 is connected between the ouput connector P2 of the video adapter 2 and connectors P1 and P3 of the aircraft pylon 6.

Figure 2A:
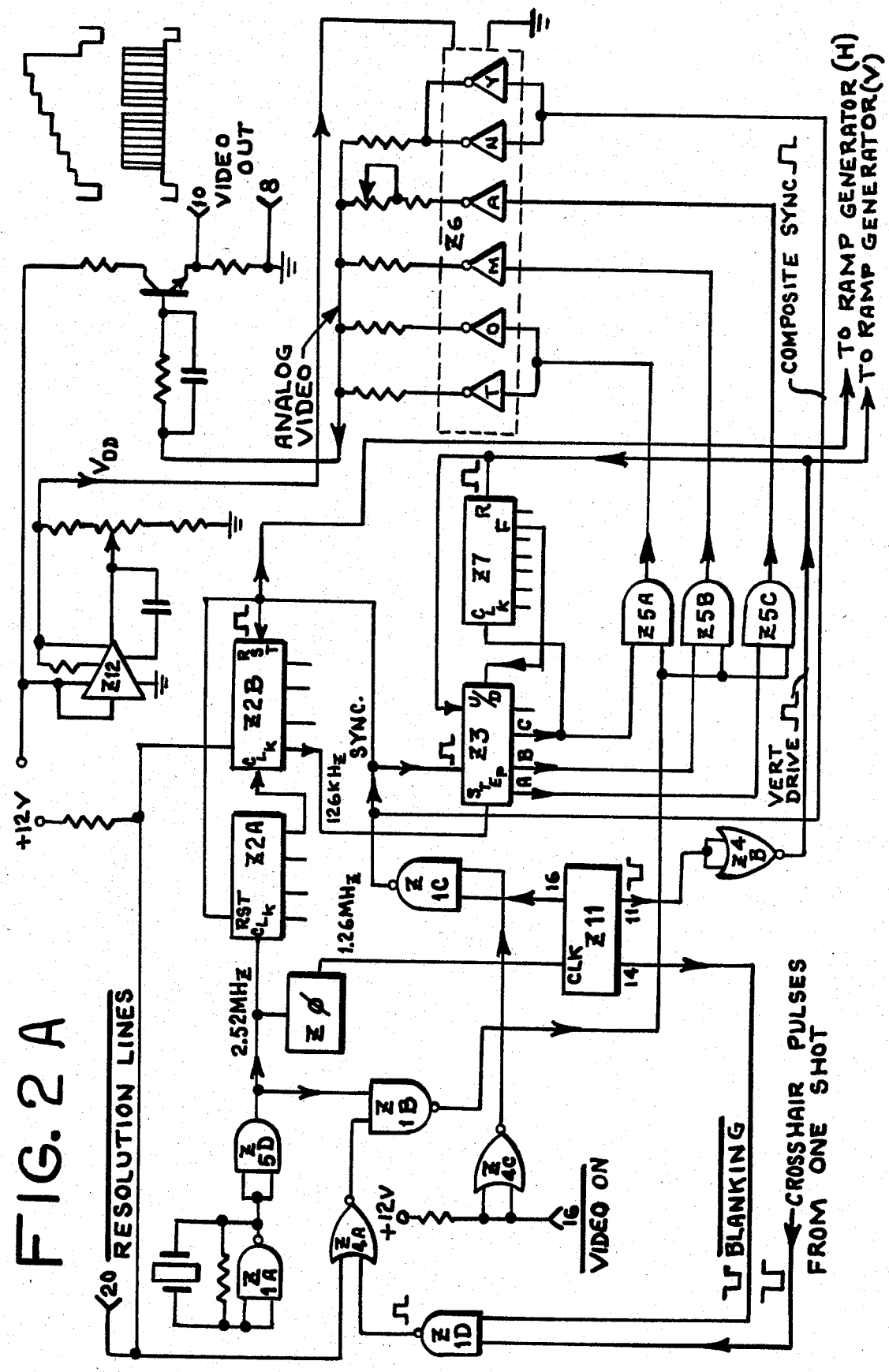
FIGS. 2A and 2B, collectively, provide a circuit representation of the video board portion of the present invention, and FIGS. 3A and 3B, collectively, provide a circuit representation of the signal scalar board portion of the present invention.
Figure 2B:
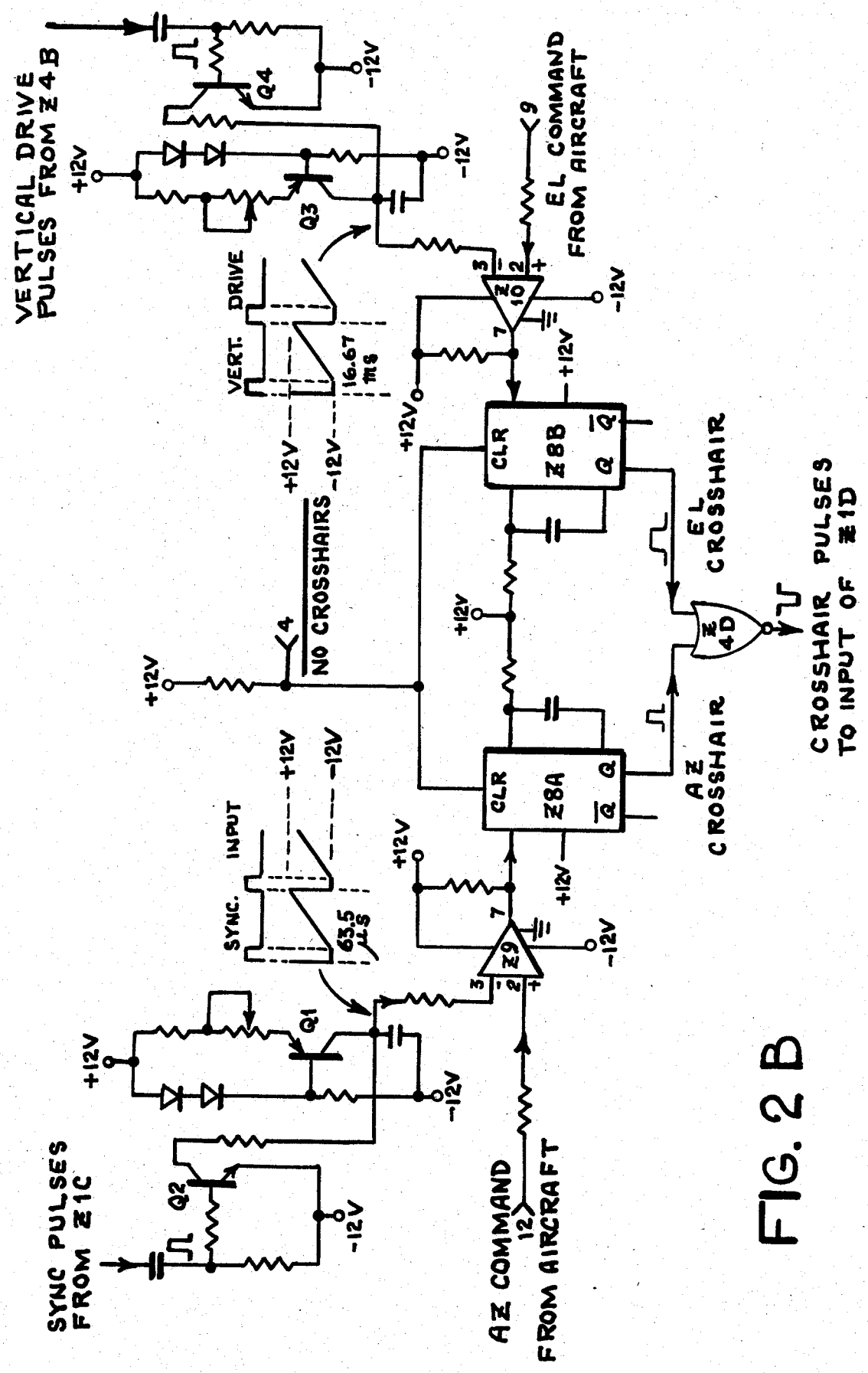

The operation of the various functional units of the video board shown in FIGS. 2A and 2B are described in detail below.

MASTER OSCILLATOR AND CLOCK GENERATOR

Nand gate Z1A is used as an inverter, biased into linear operation. It has a parallel 2.52 MHz crystal stabilizing the frequency of oscillation. Z5D is used as a buffer to prevent oscillator loading. The output is a 2.52 MHz square wave swinging from nearly +12 volts to nearly 0 volts. $Z\phi$, a "D" flipflop divides the 2.52 MHz to 1.26 MHz for use by Z11.

The master clock generator, is comprised of coscaded decade counters Z2A and Z2B whose divide by 20 output is used in the video signal adapter. All other outputs are unused. $Z\phi$ provides a 1.26 MHz to Z11, a PMOS TV camera sync generator. The MM5320 type sync generator unit operates across the commercial temperature range, 0° C. to +70° C. If absolutely essential, the functionally-identical MM5321 could be used. The MM5321 is available in military specification ranges of −55° C. to +125° C. The divide by 10 output of Z2A, 252 KHz is fed to Z2B. Z2B's divide-by-2 output, 126 KHz, is fed to Z3, the staircase counter.

The staircase counter Z3, is a 4-bit binary up/down counter which is preset to a binary "15" (all outputs high), during each H or V sync pulse. Z3's third output ("C" output; "4" output in a 1-2-4-8 scheme) is fed to Z7. The "C" output of Z3 would be 15750 Hz were it allowed to "free run". However, since it is loaded during sync periods, its output is 15750 Hz only between V sync pulses. (The Horizontal sync frequency is 15750 Hz).

Z7 is a seven stage binary counter. The input to Z7 is a 15750 Hz low duty cycle pulse. Each pulse in represents one horizontal line of video. Every 32 H lines, the "F" output of Z7 changes state. This output is fed back to Z3, the staircase counter, where it is used to change the "count up/count down" mode control line. Z7 is the line counter, and is reset to 0 during each Vert drive signal. (Vert drive roughly corresponds to the V sync pulse in time and duration.)

TV SYNCH GENERATOR Z11

The MM5320 (or MM5321) provides the basic composite sync, composite blanking, and vertical drive signals used by the video signal adapter. Numerous other signals, including color signals are generated in the MM5320, but are unused. Since it is a PMOS LSI device, it requires a +12, −5 v supply. The −6 v supplied by the AN/APM-307 is run through a series diode to provide approximately −5.3 volts, well within the allowable 17 volt plus or minus 5% total Vss-Vdd. All of the MM5320 outputs are negative-going, "complement" signals. They are also inverted by gates in Z1C, Z4B and Z1D prior to use by the video signal adapter. Synchronization is provided out of pin 16 and inverted by Z1C. The complement of the vertical drive signal is provided from pin 11 and is inverted in Z4B. Blanking from pin 14 can be inverted in Z1D.

GRAY SCALE GENERATION

Z3, a four stage up/down counter is the heart of the gray scale generator. While it has four outputs, A, B, C, D, only the first three are directly used. It will be noted that counting in binary, the first three outputs will react identically when counting 0-7 and 8-15. Whenever a sync pulse is received from Z1C, a logic high "jam" input to all four counter stages forces Z3 to display a binary 15. At the same time, the positive sync pulse is applied to Z2B, shutting down the 126 KHz input to Z3. Either the high "jam" (preset enable) or the shutdown of the 126 KHz input will serve to prevent Z3 from counting until the SYNC pulse is gone.

The A, B, and C outputs of Z3 are applied through AND gates in Z5C, Z5B and Z5A respectively to the level shifters/inverters in Z6. The SYNC pulse is also applied to Z6. The outputs of Z6 are tied into a weighted resistor network which performs digital to analog conversion. During a SYNC pulse, all inputs to the digital to analog converter, Z6, are high. (This is true during all video modes, including resolution lines). Since all DAC (digital to analog converter) inputs are high, the inversion in Z6 ensures all low outputs for a zero volt output. This corresponds to an H or V sync tip as applied to the aircraft.

When the SYNC pulse subsides, the N and Y inverters in Z6 go high. This provides about 0.8 volts when observed at the aircraft. This is the blanking level. Z2B can start counting again since the SYNC pulse is no longer present, providing 126 KHz pulses to Z3. Unavoidable propagation delays ensure at least a minimal period of blanking for scopes. Blanking is 4.76 microseconds for resolution line video and 3.8 microseconds for gray scale.

The first 126 KHz pulse into Z3 decrements the counter to a binary "14". Z3 outputs to the DAC are: A-L, B-H, C-H. Z6 inverts these to H (inverter A), L (inverter M), L, (inverters T and 0 in Z6). About 1.11 volts is observed at the output video terminal, an increase of approximately 0.31 volts over the blanking level. This an "almost black" level.

Succeeding 126 KHz pulses into Z3 continue to cause it to count down, with an additional 0.31 volts increase in video output for each step. Each step of the staircase is approximately 8 microseconds long. With the seventh step, all Z3 outputs are low and the video level peaks at about 3.04 volts. On the eighth step, Z3 presents a binary "7", (HHHL) and the three outputs applied to the DAC ensure the blanking level is established at 0.8 volts. The next sync pulse again drops the video output to 0 volts, and one horizontal line has been completed. This ascending staircase continues for 64 horizontal lines.

As each horizontal line is completed, the line counter, Z7 counts them. Every 32 lines, Z7's "F" output changes state and this is fed to Z3's UP/DOWN mode control line. (Z7 starts each counting sequence with all outputs low. This is because it is reset by the VERT DRIVE signal, which is 9 H lines long centered around the vertical SYNC pulse in time.) At line number 63 this "F" output goes high for the first time, reversing the staircase video waveform. The binary "15" loaded into Z3 during the SYNC pulse still provides a blanking level at the beginning of a line, but the 126 KHz pulses now overflow the counter to binary "0", (LLLL) followed by binary "1", (HLLL), binary "2", (LHLL), etc. The video wave form is now a descending staircase. This also continues for 64 lines at which time Z7 output again changes state. The staircase reverses direction every 64 lines.

Unlike the AN/ASM-184, no thick black bars are provided by the video signal adapter between gray scale squares. It was believed that these bars can mask video distortion. The small change in level, step-to-step, should look like just that—a slight change in brightness. A poor scope will show "shadows" which would be masked by thick black bars. However, slight disturbances (asynchronous counting spikes) can be observed at the beginning of each stairstep. These were retained to help define the level change on the scope, particularly the center three gray squares. It should be noted that these spikes aid definition on the scope face, yet would normally be thought of as unwanted and undesirable. The disturbances spike towards white and/or black, depending upon which step is observed and which direction (ascending, descending) the staircase is moving. Where the AN/ASM-184 provides thick, 1 microsecond black bars, the video signal adapter of the present invention provides spikes less than 100 nanoseconds long.

RESOLUTION LINES VIDEO GENERATION

As in gray scale video generation, Z3 is loaded to a binary "15" during each SYNC pulse. The three lower-order bits are presented to the DAC, Z6, as HHH. The SYNC Pulse is also presented to the DAC as a high logic level from Z1C. However, Z2B is shutdown by the low RESOLUTION LINES control output, and no 126 KHz pulses are sent to Z3. (The RESOLUTION LINES control input is under program control by the AN/APM-307. When the AN/APM-307 selects this display, the RESOLUTION LINES input is grounded out continuously.)

During the SYNC pulse, 0 volts video level is sent to the aircraft. When the SYNC pulse subsides, Z6N and Z6Y reestablish a 0.8 volt blanking level. Z1D provides BLANKING (4.76 microseconds long) to Z4A. Z4A inverts this BLANKING signal to provide a low input to Z1B. Z1B's output must go high as long as any input is low. Z1B thus provides a high logic level to the AND gates of Z5. These, in turn, couple the Z3 outputs to the DAC.

When the 4.76 microsecond BLANKING pulse subsides, Z4A's output will go high. At this time, Z1B will effectively pass an inverted form of the 2.52 MHz square wave to the Z5 AND GATES. Z5 outputs to the DAC will now oscillate at 2.52 MHz, and the DAC will provide a 2.52 MHz wave swinging from about 0.9 volts to 3.1 volts video to the aircraft. At 1.59 microseconds before the next SYNC pulse, BLANKING is reestablished through Z1D, Z4A, Z1B, and Z5 AND gates. This is the front porch blanking, immediately followed by a SYNC pulse, 4.76 microseconds long. One H line is complete.

CROSSHAIRS VIDEO GENERATION

Operation is identical to Resolution Line Video, except horizontal and vertical one-shots in Z8A and Z8B, can provide a short CROSSHAIR pulse to Z1D via Z4D. This CROSSHAIR pulse, when applied to Z1D will function in a manner similar to the BLANKING pulse, ensuring that 2.52 MHz never reaches the AND GATES in Z5.

The crosshair pulses provide a "blacker-than-black" 0.8 volt interruption in the 2.52 MHz resolution lines. The $\overline{\text{NO CROSSHAIRS}}$ control lines is under program control by the AN/APM-307, and is grounded at all times, except when crosshair video is called for by the AN/APM-307. (Z8a and Z8b cannot provide pulses when the $\overline{\text{NO CROSSHAIRS}}$ control line is low.) Z8A provides one crosshair pulse to Z4D for each horizontal line, while Z8B provides one rather long crosshair pulse for each vertical drive pulse.

Each horizontal SYNC pulse is capacitively coupled into the base resistor of Q2 saturating it "full on". Q2 thus shorts out any charge stored in the 0.001 microfarad capacitor during each SYNC pulse. When the SYNC pulse subsides, Q2 shuts off, allowing constant-current source Q1 to charge the capacitor linearly with time. The capacitor charges linearly from $-12$ volts to $+12$ volts. The potentiometer in Q1's emitter leg allows the slope of this charge "curve" to be adjusted. The ramp voltage from the capacitor is fed to the inverting input of voltage comparator Z9.

Z9 compares the ramp voltage with the AZ CONTROL voltage from the aircraft, which is variable from $-12$ to $+12$ volts. When the ramp voltage exceeds the control voltage, Z9's output goes low, triggering the one shot, Z8A, into providing an AZimuth (horizontal) CROSSHAIR through Z4D to the rest of the video generator.

ELEVATION crosshairs are generated in exactly the same way by Q3, Q4, Z10, and Z8B, except that the VERT DRIVE signal turns on Q4, removing the capacitor charge (Instead of the SYNC signal discharging the capacitor). ELEVATION (vertical) crosshairs have much longer time periods for all the pulses than the AZ crosshairs. There is one long crosshair pulse from the EL circuit every vertical field (16.67 milliseconds).

In practice the AZ and EL crosshairs are adjustable to provide a centered crosshair in the middle of the scope when the AZ and EL controls are 0.0 volts. This ramp slope adjustment is necessary because DSCG and DVST scopes display slightly different characteristics. (Quite simply DSCG scopes display virtually everything between sync pulses. The DVST scopes require a considerably longer "back porch" blanking for horizontal retrace.)

The crosshairs are positionable at least to the extreme edges of the scope, as viewed in the aircraft cockpit. In fact, the crosshair pulses can be so displaced in time that the pulses occur during blanking, where they cannot be seen in the aircraft cockpit. This serves two purposes; controller positioning visibility and a test of the radar scope's ability to differentiate between a sync pulse and a drop in video level to the blanking level of 0.8 volts. The technician in the cockpit checks to ensure the crosshairs slave to the position he selects with the Maverick controller. A malfunctioning scope may sync to the crosshair, (which comes reasonably close to the same width as a synch pulse, yet maintains a 0.8 volt level), thus indicating immediately that the scope needs repair. This method may prove to be superior than a similar method in the AN/ASM-184, where a moving band of resolution lines traces from left to right across the scope. (The video signal adapter crosshair can also be moved up and down on the scope, thus allowing a check of vertical sync lock. The AN/ASM-184 is incapable of this.) The $\overline{\text{VIDEO ON}}$ line is also under AN/APM-307 program control. When this control line is high, Z4C locks out SYNC pulses from NAND gate Z1C providing high sync to all circuits. Video output is 0 volts.

VIDEO OUTPUT CIRCUIT 12 is a regulated power supply for the DAC, Z6. It is an LM300 device which drops the AN/APM-307 +12 volt power to a well-regulated, adjustable +3 to +9 volts with current limiting. It is adjustable so that the video amplitude can be adjusted across a wide range. Initial calibration calls for applying a 100 ohm termination to the video output line. (This loading drops the video amplitude considerably.) In this way, the nominal 93 ohm cabling in the aircraft can be exactly compensated for, with peak-two-peak video amplitude adjustable from about 1.4 volts to greater than 3.0 volts.

Since the DAC is running close to its maximum peak power dissipation when operated at +9 volts Vdd, passive components of Z12 have been selected to limit the current at a value well under the maximum power dissipation of Z6. It should be noted that the video waveform retains its proportions, regardless of output amplitude. (For example, the blanking level is 26% of total amplitude, regardless of that amplitude.) Due to the excellent tracking of the DAC inverters, standard 5% resistors can be used in the DAC, except for one adjustable resistor connected to Z6A, a critical adjustment which provides gray scale step number 4 exactly half-way between black and white.

SCALAR BOARD

Figure 3A:
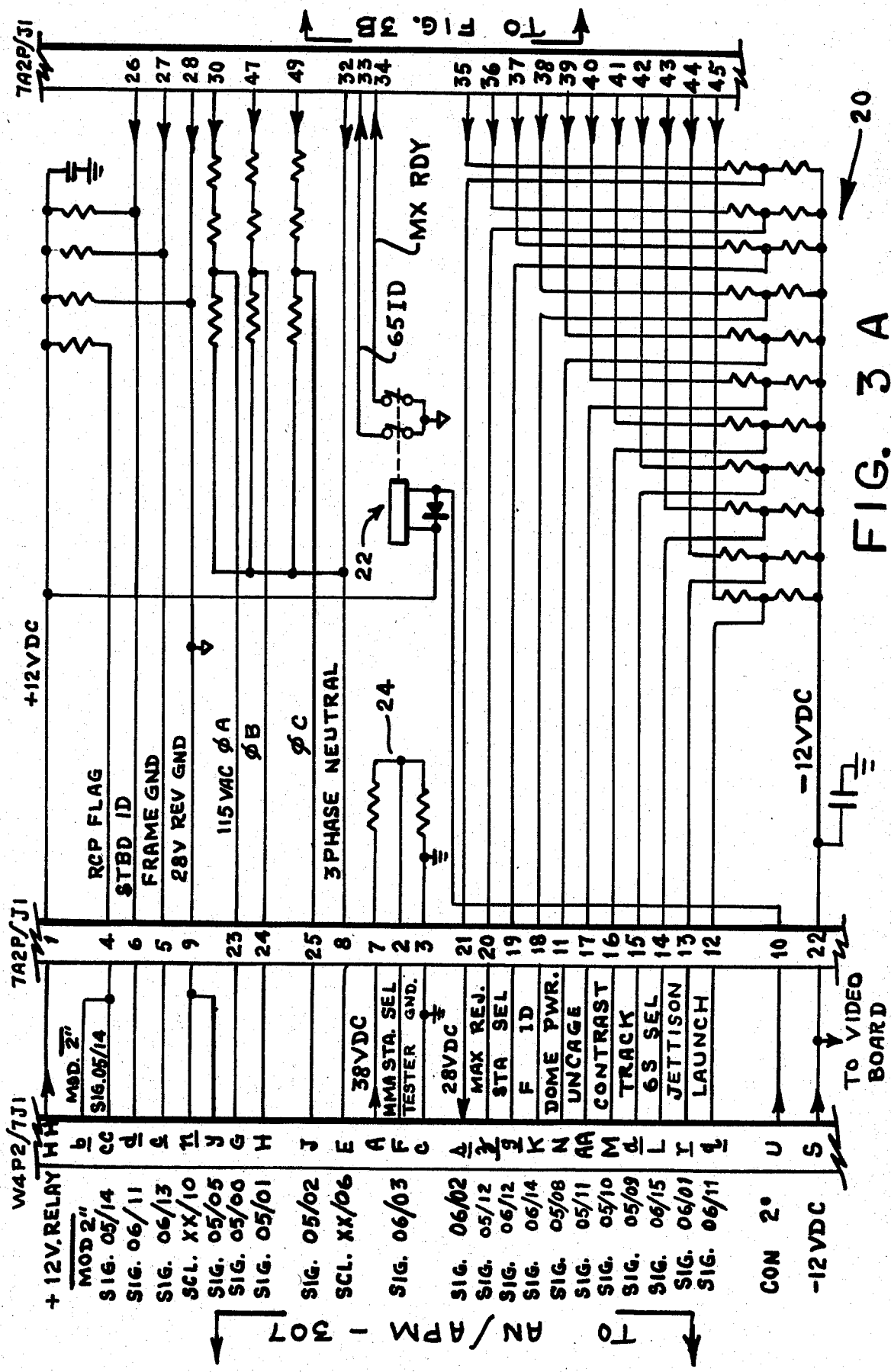

The scalar board, shown in the combined FIGS. 3A and 3B, provides the connections necessary to accept the video generator board and interface the video signal adapter between the test set and the aircraft pylon. It also contains the resistive voltage dividers 20 used to scale down aircraft signals to levels within the capabilities of the AN/APM-307 test set. Signals of +28 vdc are biased through voltage dividers to −12 vdc. A relay 22 switches aircraft "65 ID" and "MSL RDY" signals under program control by the test set. This board also contains a resistive network 24 which enables the AN/APM-307 to determine MSA or MMA presence, and can ensure that the test set knows which side of the aircraft is presently under test.

Although the invention has been described with reference to a particular embodiment, it will be understood to those skilled in the art that the invention is capable of a variety of alternative embodiments within the spirit and scope of the appended claims.

What is claimed is:

1. In an apparatus for testing the performance of an airborne missile control system having a display scope, said apparatus including a programmable dynamic test set for generating control signals, for measuring system parameters of said missile control system and for providing a printed record of test results, the improvement therein comprising:

a video signal adapter electrically interposed between said test set and said missile control system for providing video signals to the display scope of said missile control system;

said video signal adapter having means for selectively providing a gray scale display signal, a resolution lines display signal and a movable crosshairs display signal in said missile control system in response to the control signals emanating from said test set, and means within said video signal adapter for adjusting the voltage levels of parameters received from said missile control system for processing by said test set;

said video signal adapter further including a master clock generator having a crystal controlled oscillator, a decade counter coupled to said oscillator, a staircase counter coupled to the output of said decade counter, and a line counter receiving output pulses from said staircase counter and providing mode control pulses to said staircase counter, and a sync generator receiving clock pulses from said crystal controlled oscillator and providing composite sync, composite blanking and vertical drive pulses for use in said video signal adapter;

said means for providing said gray scale display signal including a plurality of AND gates each having first and second input leads and an output lead, each of said AND gates having its first input lead connected to an output stage of said staircase counter and having its second input lead connected to a common terminal, said common terminal receiving clock pulses from said crystal controlled oscillator, each of said AND gates having its output lead resistively coupled to a common analog video line;

said means for providing said resolution lines display signal including first gating means interposed between said common terminal and said clock pulses, said first gating means being operative in response to resolution line control signals received from said dynamic test set;

said means for providing a movable crosshairs display signal including a first one-shot multivibrator adapted to provide vertical crosshair pulses in response to azimuth control signals from said missile control system and crosshair command signals from said dynamic test set, a second one-shot multivibrator adapted to provide horizontal crosshair pulses in response to elevation control signals from said missile control system and said crosshair command signals from said dynamic test set, and means for coupling said vertical and horizontal crosshair pulses to said first gating means whereby said clock pulses may be isolated from said common terminal during the time occurrences of said crosshair pulses;

said means for adjusting the voltage levels of parameters received from said missile control system comprising a plurality of resistor divider networks.

* * * * *